US006329882B1

United States Patent
Fayneh et al.

(10) Patent No.: US 6,329,882 B1
(45) Date of Patent: Dec. 11, 2001

(54) THIRD-ORDER SELF-BIASED PHASE-LOCKED LOOP FOR LOW JITTER APPLICATIONS

(75) Inventors: Eyal Fayneh, Givataym; Ernest Knoll, Haifa, both of (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/468,220

(22) Filed: Dec. 20, 1999

(51) Int. Cl.$^7$ .................................................. H03L 7/093
(52) U.S. Cl. .................. 331/10; 331/8; 331/17; 331/25; 713/503
(58) Field of Search .................. 331/8, 17, 10, 331/25; 327/157; 713/500, 503

(56) References Cited

U.S. PATENT DOCUMENTS 5,629,650 * 5/1997 Gersbach et al. ..................... 331/17
5,740,213 * 4/1998 Dreyer ................................... 331/17
5,870,003 * 2/1999 Boerstler .............................. 331/17

* cited by examiner

Primary Examiner—Siegfried H. Grimm
(74) Attorney, Agent, or Firm—Fish & Richardson P.C.

(57) ABSTRACT

A self-biased phase-locked loop circuit includes a phase detector, first and second charge pumps, first and second loop filters, and a voltage-controlled oscillator (VCO). The phase detector is configured to measure a phase offset between two input signals, and to generate pulses corresponding to the phase offset. The first and second charge pumps are configured to provide charge corresponding to the pulses. The first and second loop filters are coupled to outputs of the first and second charge pumps, respectively. The filters operate to provide a control signal responsive to the charge. The VCO is configured to adjust its output frequency in response to the control signal. The second loop filter capacitor considerably improves the output clock jitter.

30 Claims, 7 Drawing Sheets

THIRD-ORDER SELF-BIASED PHASE-LOCKED LOOP FOR LOW JITTER APPLICATIONS

BACKGROUND

This disclosure relates to self-biased phase-locked loops (SBPLLs) and more specifically, to a low jitter design for a SBPLL.

Conventional phase-locked loop (PLL) 100, shown in FIG. 1, generally includes a phase detector 102 for monitoring a phase difference between a reference signal and the feedback signal (frequency divided output signal of a voltage-controlled oscillator—VCO 108). The phase detector 102 generates an UP control signal 110 and a DOWN control signal 112 for a charge pump 114 to respectively charge and discharge a loop filter 116. The loop control voltage 118 developed across the loop filter 116 determines the output frequency of the VCO 108. The UP and DOWN control signals 110, 112 driving the charge pump 114 set the proper loop filter control voltage 118 at the input of the VCO to maintain a minimal phase error between the signals applied to the phase detector 102.

PLLs are widely used in data communications, local area networks in computer applications, microprocessors and data storage application to control data transfers. However, the rising demand for high-speed applications requires reduced clock period. As a consequence, increased accuracy of the clock frequency is requested. The clock frequency accuracy is affected by jitter. One source of jitter is the noisy environment in which PLLs must function. Another important source of jitter is the so-called 'reference-feed-through jitter' or 'quiet jitter'. Even when the PLL is locked there is still a small amount of phase error that determines a short pulse at the steering line of the VCO. In response to this short pulse, the VCO changes its phase. Since these pulses occur every reference cycle, the spectral component of the 'quiet jitter' is the reference frequency. With a shrinking tolerance for jitter in the decreasing period of the output clock, the design of low jitter PLLs has become very challenging.

Self-biased techniques have been proposed for low-jitter PLLs in "Low-Jitter Process-Independent DLL and PLL Based on Self-Biased Techniques," John G. Maneatis, IEEE Journal of Solid-State Circuits, vol. 31, No. 11, pp. 1723–1732, November 1996. The paper proposes a self-biased PLL "SBPLL" circuit.

SUMMARY

A self-biased phase-locked loop circuit includes a phase detector, charge pumps, loop filters, and a voltage-controlled oscillator (VCO). The phase detector is configured to measure a phase offset between two input signals, and to generate pulses corresponding to the phase offset. The first and second charge pumps are configured to provide charge corresponding to the pulses. The first and second loop filters are coupled to outputs of the first and second charge pumps, respectively. The filters operate to provide a control signal responsive to the charge. The VCO is configured to adjust its output frequency and phase in response to the control signal.

BRIEF DESCRIPTION OF THE DRAWINGS

Different aspects of the disclosure will be described in reference to the accompanying drawings wherein.

DESCRIPTION OF THE PREFERRED EMBODIMENTS

Figure 1:
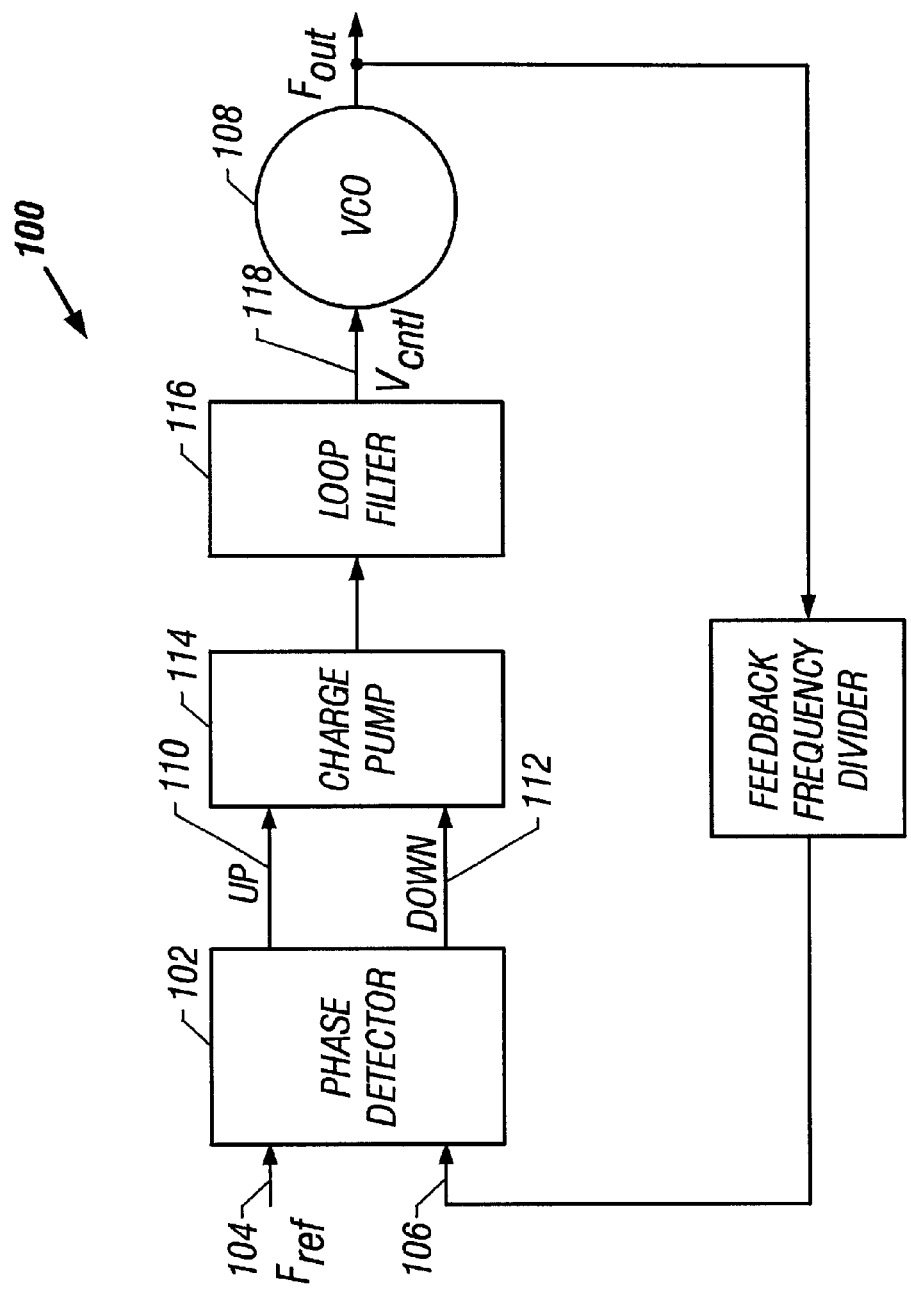
FIG. 1 is a block diagram of a conventional phase-locked loop.
Figure 2:
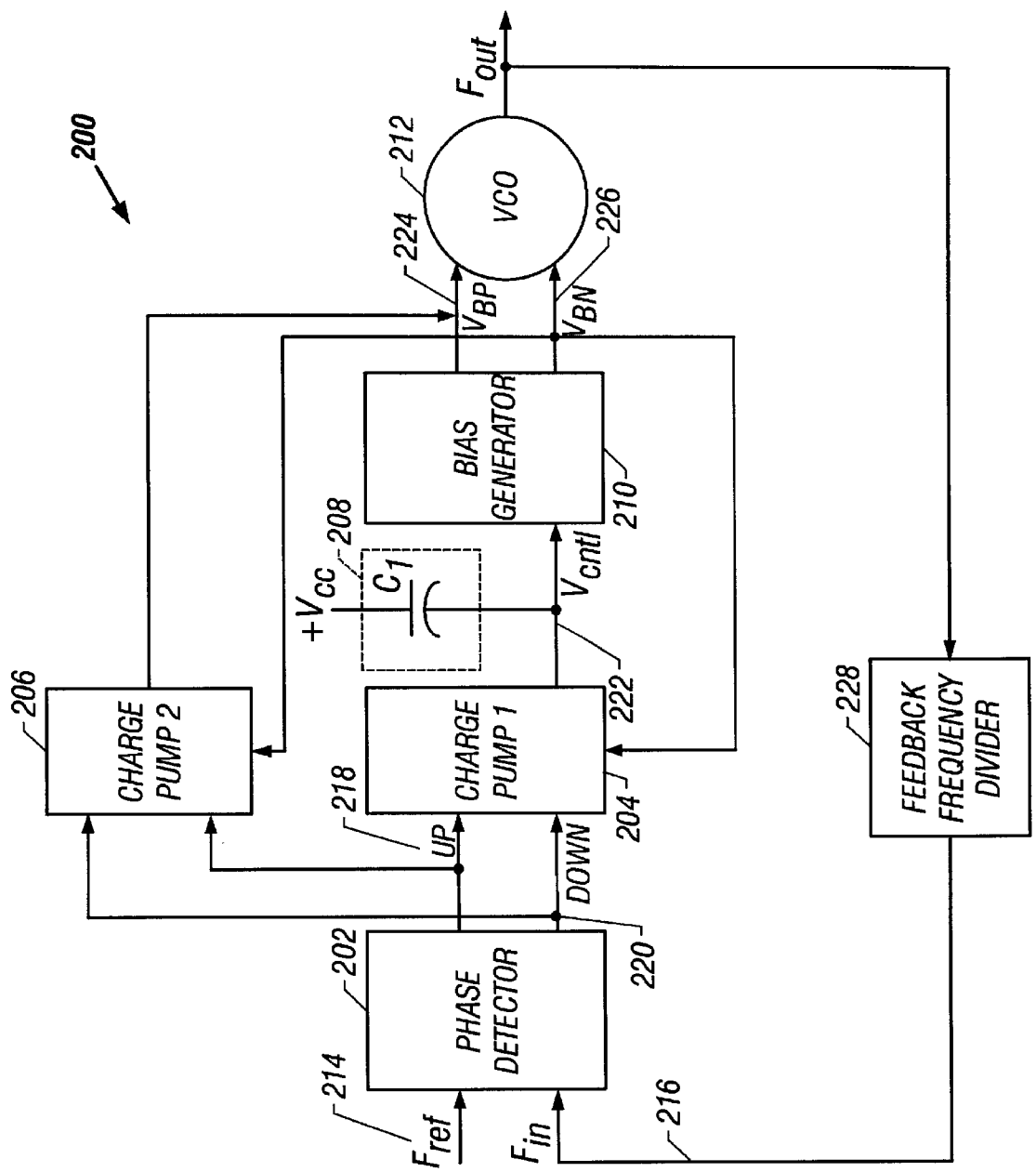
FIG. 2 is a simplified block diagram of current SBPLL having a bias generator.

FIG. 2 shows a simplified block diagram of a self-biased PLL (SBPLL) circuit having a bias generator 210. The SBPLL further includes a phase detector 202, charge pumps 204, 206, a loop filter 208, a voltage-controlled oscillator (VCO) 212, and a frequency divider 228. The bias generator 210 generates two bias voltages, $V_{BN}$ 226 and $V_{BP}$ 224. $V_{BN}$ 226 controls the VCO 212 and the charge pumps 204, 206 to enable the self-biasing technique while $V_{BP}$ 224 is the control voltage of the VCO 212.

The phase detector 202 uses inputs $F_{ref}$ 214 and $F_{in}$ 216, and outputs UP 218 and DN 220. The phase detector 202 measures the phase difference between the two inputs 214, 216 and outputs a pulse having a width substantially equal to the difference amount. The pulse is sent to the UP signal 218 if $F_{ref}$ leads $F_{in}$ and is sent to the DN signal 220 if $F_{ref}$ lags $F_{in}$. The outputs 218, 220 of the phase detector 202 are inputs to charge pumps 204, 206.

Each charge pump uses an UP input to produce a negative current pulse at the output of charge pump module 204. It uses a DN input to produce a positive current pulse at the output of charge pump module 204. The output 222 of the charge pump 204 drives a loop filter 208, and becomes a bias generator 210 control line, $V_{cntl}$. The output of the charge pump 206 is coupled to the $V_{BP}$ output 224 from the bias generator 210, and serves as an input to the VCO 212.

The loop filter 208 includes a capacitor that acts as a low pass filter. One terminal of the capacitor is connected to a supply voltage, $V_{CC}$. The other terminal is connected to $V_{cntl}$. The capacitor in the loop filter 208 integrates the current generated by the charge pump 204 to smooth the $V_{cntl}$ 222. The filter 208 also provides stability to the operation of the SBPLL 200 by suppressing high frequency noise.

The loop filter 208 outputs a filtered voltage to the $V_{cntl}$ input of the bias generator 210. The bias generator 210 receives $V_{cntl}$ and converts it to the proper bias ($V_{BN}$) 226 for controlling current sources in the VCO 212 and in the charge pumps 204, 206. The bias generator 210 together with the charge pump 206 also generates $V_{BP}$ 224.

Figure 3:
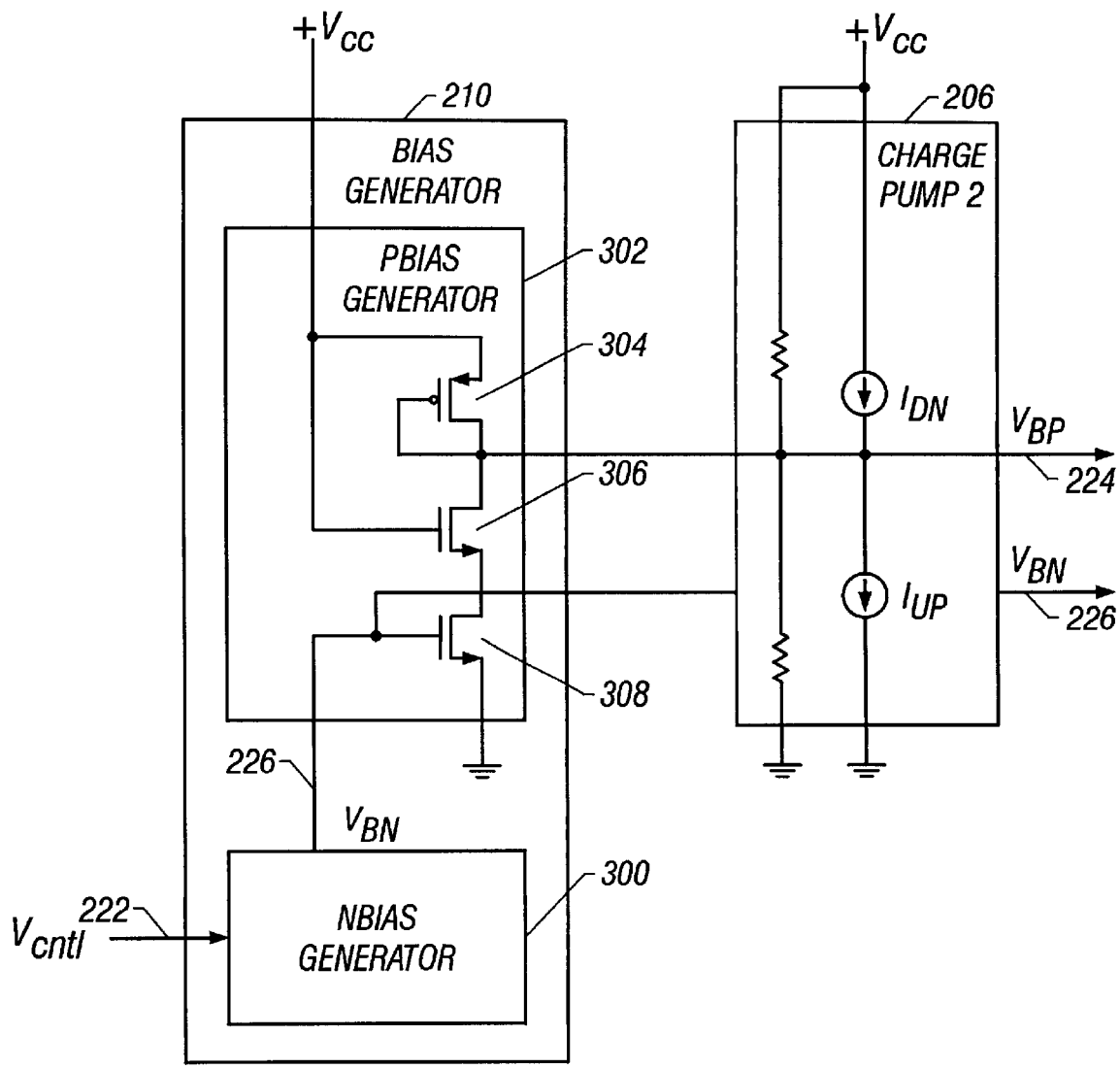
FIG. 3 is a detailed diagram of the bias generator.

A detailed diagram of the bias generator 210, along with the charge pump 206, is shown in FIG. 3. The bias generator 210 includes an N-bias generator 300 and a P-bias generator 302.

The N-bias generator 300 receives the control voltage, $V_{cntl}$ 222, and generates a bias voltage, $V_{BN}$ 226. The bias voltage $V_{BN}$ 226 properly biases current sources in the VCO 212 and in the charge pumps 204, 206.

The P-bias generator 302 receives the $V_{BN}$ bias voltage 226 and generates a VCO steering voltage, $V_{BP}$ 224. Transistors 304, 306 implement the loop filter resistor. The transistor 308 current, controlled by $V_{BN}$, sets the resistance value.

The output resistance of the current sources in the charge pump 206, in conjunction with transistors 304, 306, produces an equivalent loop filter dynamic resistance on the VCO steering line, $V_{BP}$ 224. Hence, when the loop is locked, the charge pump 206 produces current pulses that generate voltage pulses on the VCO steering line 224. The amplitudes of these voltage pulses are a product of the charge pump current and the dynamic loop filter resistance. Further, these pulses modulate the VCO output phase at the reference frequency, $F_{ref}$, and cause VCO output jitter. The pulses also cause the charge pump current to decrease, and momentarily reduce a phase detector gain. These results cause loop bandwidth and damping factor to momentarily drop.

Figure 4:
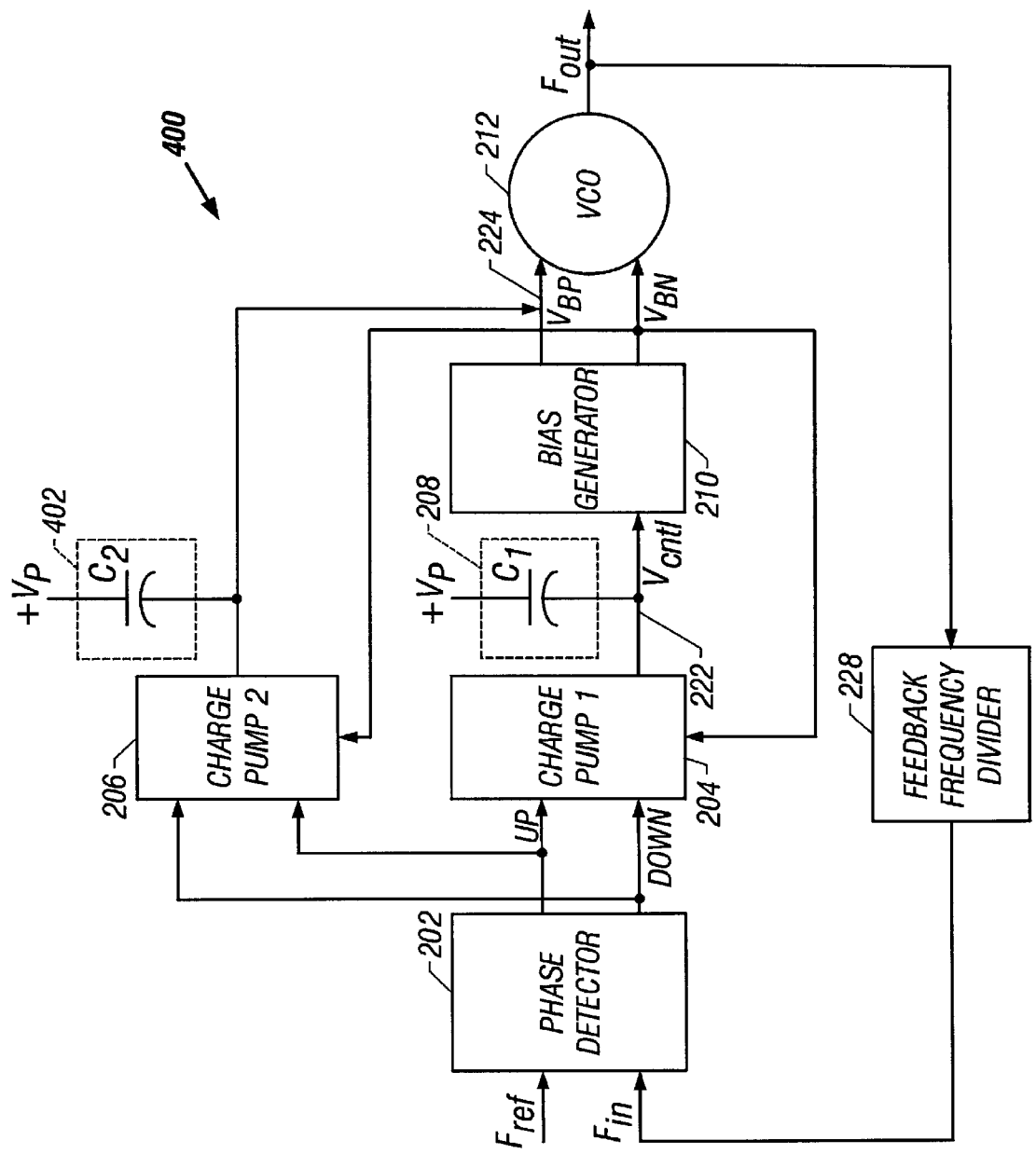
FIG. 4 is a block diagram of an improved SBPLL design.

A block diagram of another embodiment 400 is shown in FIG. 4. The new design 400 includes an additional loop filter capacitor $C_2$, at the output of the charge pump 206. Adding the capacitor $C_2$ changes the SBPLL from second order to a third order SBPLL. The capacitor in the filter 402 prevents the VCO control voltage 224 from changing too rapidly, by integrating the charge pump current pulses. The resultant voltage pulse amplitudes at the VCO voltage steering line 224 are significantly reduced. Hence, the charge pump gain becomes stable over time. Further, the output jitter performance is significantly improved.

Figure 5:
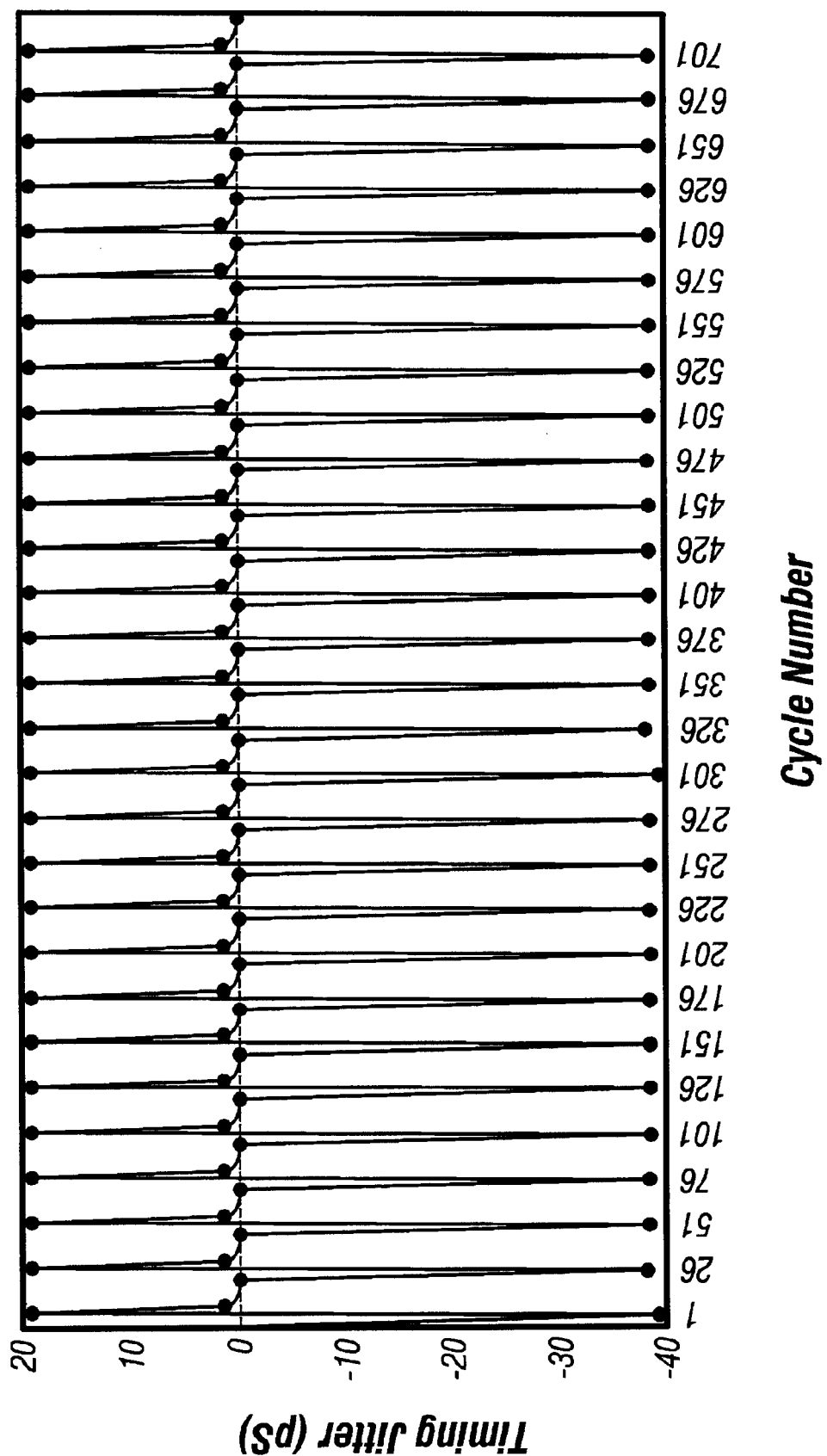
FIG. 5 shows one example of a VCO timing jitter present in the current SBPLL design.

A VCO timing jitter that can be present in the SBPLL design 200 is illustrated in FIG. 5. The timing jitter is based on a SBPLL chip running at 800 MHz. The operating frequency of the SBPLL chip running at 800 MHz translates into 1.25 nano-seconds or 1250 pico-seconds of the worst-case speed path.

The peak-to-peak timing jitter has been measured to be approximately 57 pico-seconds. This means that, in some clock cycles, the available propagation time for the logic paths is lower by approximately 57 pico-seconds (1250−57=1193 pico-seconds). Thus, in order to provide enough propagation time for the logic path, the clock cycle must be extended by that amount to 1307 pico-seconds (1250+57). The clock frequency in this case changes to about 765 MHz instead of the 800 MHz. Therefore, the maximum chip operating frequency decreases by about 35 MHz.

Figure 6:
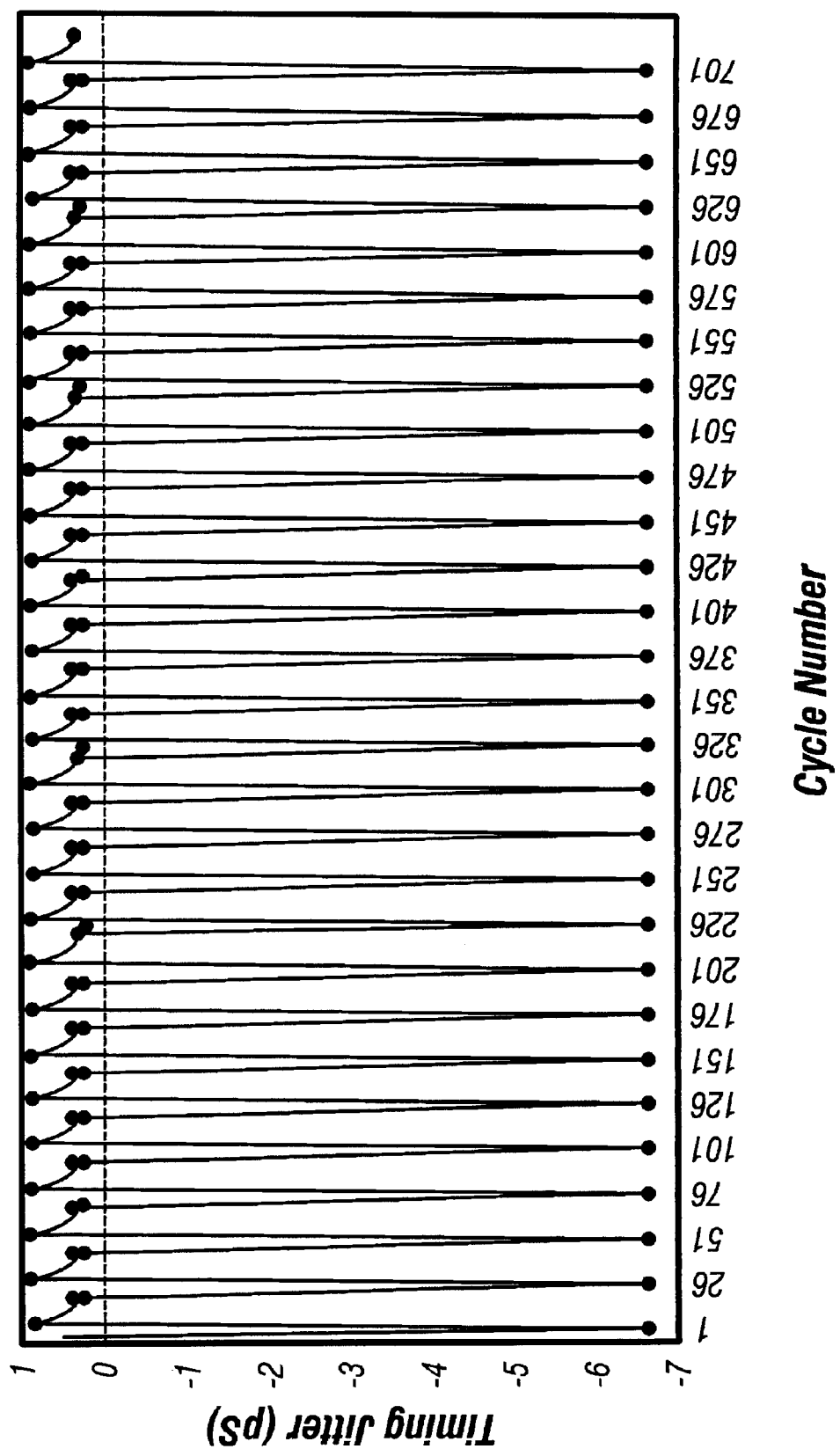
FIG. 6 shows one example of the VCO timing jitter present in the improved SBPLL design.

FIG. 6 illustrates the VCO timing jitter present in the third-order SBPLL design 400 shown in FIG. 4. The timing jitter is again based on a chip running at 800 MHz. However, the peak-to-peak timing jitter is now measured to be about 7 pico-seconds. Thus, in order to provide enough propagation time for the logic paths with the new SBPLL design, the clock cycle must be extended 7 pico-seconds to 1257 pico-seconds. The clock frequency in this case changes to about 795 MHz instead of the 800 MHz. Therefore, the maximum chip operating frequency decreases only by about 5 MHz. This represents an improvement in the maximum chip frequency of 30 MHz over the SBPLL design 200.

In order to obtain improvement in the maximum chip frequency, proper sizing of the capacitor $C_2$ with respect to capacitor $C_1$ is important. Proper sizing of the capacitor $C_2$ enables optimal tradeoff between loop stability and process variations. In a preferred embodiment, the capacitor $C_2$ is between approximately 1% and 2% of the main capacitor $C_1$. Beyond about 2%, the timing jitter improvement decreases, yet the increase in the physical area occupied by the capacitor increases significantly. Also, with higher $C_2$ values, the loop stability may be affected.

Figure 7:
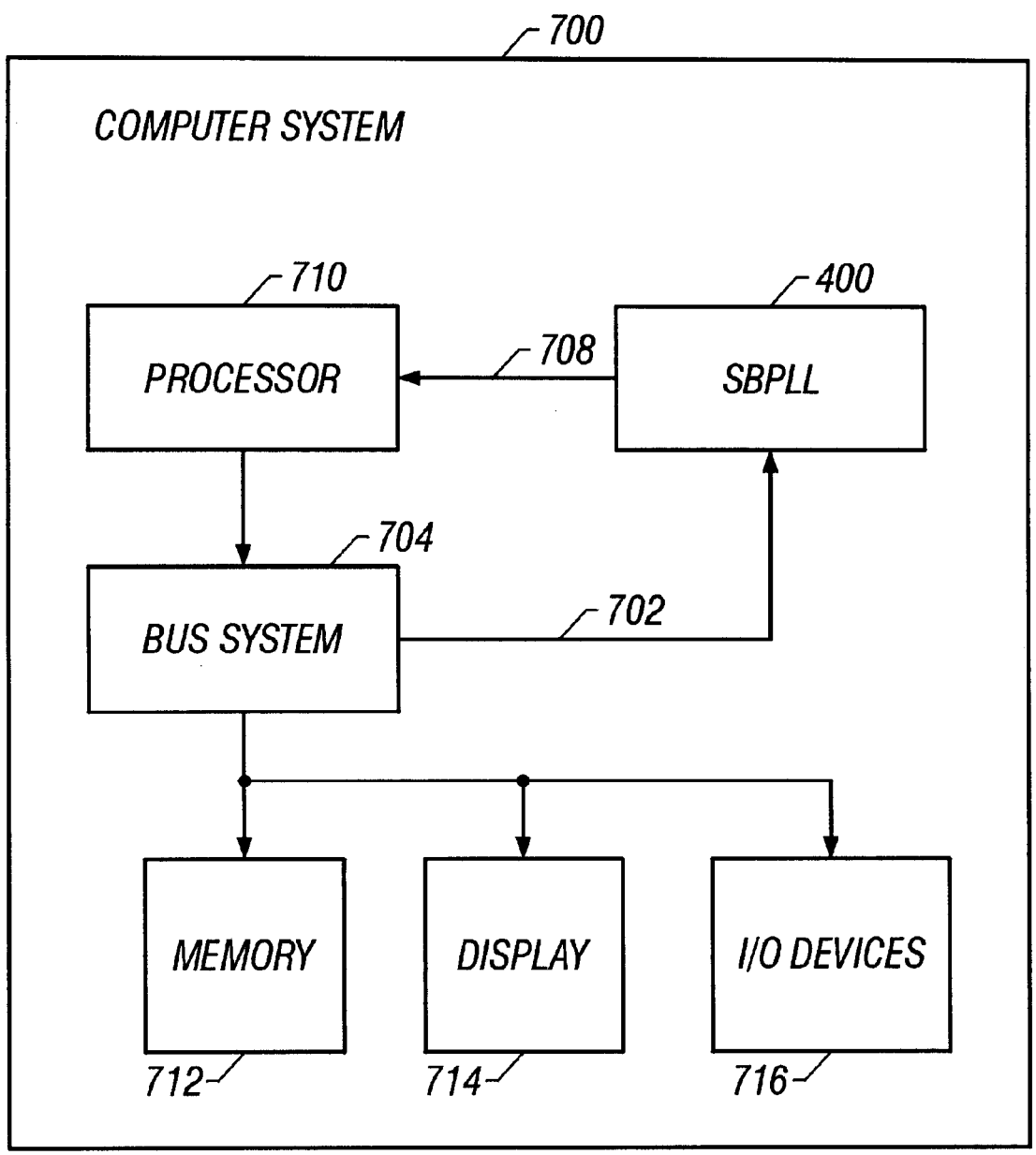
FIG. 7 is a block diagram of a computer system including an improved SBPLL.

FIG. 7 is a block diagram of a computer system 700. In one embodiment, the computer system 700 includes a SBPLL 400 having a bias generator and a properly sized loop filter capacitor at the VCO steering line. The capacitor keeps the timing jitter of the SBPLL 400 low and improves the maximum operating frequency of the chip.

The SBPLL 400 receives a bus clock 702 from a bus system 704. A phase detector in the SBPLL 400 compares the bus clock signal 702 with a feedback frequency from the VCO. The feedback frequency locks the output of the VCO to the exact multiple frequency of the bus clock 702.

The output of the SBPLL 708 is used as a clock source for a processor 710. The processor 710 is then able to interface with other components of the computer system 700, such as a memory 712, display 714, and I/O devices 716. Synchronized clocks in the processor 710 and the bus system 704 enable data in the processor 710, the memory 712, the display 714 and the I/O devices 716 to be transferred and shared across the bus system 704 with minimal data latency or data loss.

Other embodiments are within the scope of the following claims. For example, additional loop filter capacitors can be configured to provide filtering at the VCO control and steering lines. Further, the self-biased phase-locked loop can be used in applications other than the computer system described in FIG. 7. For example, they can be used in data communication systems, local area networks, and data storage applications.

What is claimed is:

1. A phase-locked loop circuit comprising:
   a phase detector to measure a phase offset between two input signals, and to generate pulses corresponding to said phase offset;
   first and second charge pumps to provide first and second charge signals corresponding to said pulses;
   first and second loop filters coupled to outputs of said first and second charge pumps, respectively, said filters providing a control signal responsive to said charge signals, wherein the second loop filter has a capacitance value relative to a capacitance value of the first loop filter that reduces reference-feed-through jitter; and
   a voltage-controlled oscillator (VCO) that adjusts an output frequency in response to said control signal.

2. The circuit of claim 1, further comprising a bias generator to provide biasing for current sources in said VCO and in said first and second charge pumps.

3. The circuit of claim 1, wherein said first and second loop filters each includes a capacitor.

4. The circuit of claim 3, wherein a capacitor of said first loop filter suppresses high frequency noise in said first charge signal.

5. The circuit of claim 4, wherein a capacitor of said second loop filter prevents fluctuation of said second charge signal too rapid for said VCO to track.

6. The circuit of claim 1, wherein the capacitance value of said second loop filter is approximately 1–2% of the capacitance value of said first loop filter.

7. A phase-locked loop circuit, comprising:
   at least two charge pumps to provide first and second charge signals;
   at least two capacitors coupled to outputs of said at least two charge pumps, including at least a first capacitor that suppresses high frequency noise in said first charge signal and that generates a control signal, and at least a second capacitor providing a smooth second charge signal, wherein a capacitance value of the second capacitor relative to a capacitance value of the first capacitor reduces reference-feed-through jitter;
   a voltage-controlled oscillator (VCO) that adjusts an output frequency in response to said control signal.

8. The circuit of claim 7, further comprising:
a bias generator to provide biasing for current sources in said VCO and in said at least two charge pumps.

9. The circuit of claim 7, wherein the capacitance value of the second capacitor is approximately 1–2% of the capacitance value of the first capacitor.

10. A computer system comprising:
a processor;
a memory configured to store data;
input/output (I/O) devices sending and receiving data from the processor and the memory;
a bus system coupled to said processor, memory, and I/O devices, said bus system facilitating transfer of data between these devices; and
a self-biased phase-locked loop (SBPLL) coupled to said processor and said bus system, said SBPLL providing clocks to enable data synchronization, said SBPLL including:
a phase detector to measure a phase offset between two input signals, and to generate pulses corresponding to said phase offset;
first and second charge pumps to provide first and second charge signals corresponding to said pulses;
first and second loop filters coupled to outputs of said first and second charge pumps, respectively, said filters providing a control signal responsive to said charge signals, wherein the second loop filter has a capacitance value relative to a capacitance value of the first loop filter that reduces reference-feed-through jitter; and
a voltage-controlled oscillator (VCO) that adjusts an output frequency in response to said control signal.

11. The system of claim 10, further comprising a bias generator in said SBPLL, said bias generator providing biasing for current sources in said VCO.

12. The system of claim 10, wherein said first and second loop filters in said SBPLL each includes a capacitor.

13. The system of claim 12, wherein a capacitor of said first loop filter suppresses high frequency noise in said first charge signal.

14. The circuit of claim 13, wherein a capacitor of said second loop filter prevents fluctuation of said second charge signal too rapid for said VCO to track.

15. The circuit of claim 10, wherein the capacitance value of said second loop filter is approximately 1–2% of the capacitance value of said first loop filter.

16. The circuit of claim 1 wherein the capacitance value of the second loop filter is less than about 2% of the capacitance value of the first loop filter.

17. The circuit of claim 16 wherein the capacitance value of the second loop filter is greater than about 1% of the capacitance value of the first loop filter.

18. The circuit of claim 1 wherein the capacitance values of the first and second loop filters are set to optimize between reference-feed-through jitter and loop stability.

19. The circuit of claim 7 wherein the capacitance value of the second capacitor is less than about 2% of the capacitance value of the first capacitor.

20. The circuit of claim 19 wherein the capacitance value of the second capacitor is greater than about 1% of the capacitance value of the first capacitor.

21. The circuit of claim 7 wherein the capacitance values of the first and second capacitors are set to optimize between reference-feed-through jitter and loop stability.

22. The system of claim 10 wherein the capacitance value of the second loop filter is less than about 2% of the capacitance value of the first loop filter.

23. The system of claim 22 wherein the capacitance value of the second loop filter is greater than about 1% of the capacitance value of the first loop filter.

24. The system of claim 10 wherein the capacitance values of the first and second loop filters are set to optimize between reference-feed-through jitter and loop stability.

25. A method of implementing a phase-locked loop, the method comprising:
measuring a phase offset between two input signals;
generating first and second charge signals corresponding to the measured phase offset;
filtering the first and second charge signals using first and second loop filters, respectively, to generate a control signal, the first and second loop filters having relative capacitance values that reduce reference-feed-through jitter;
adjusting an output frequency of a voltage-controlled oscillator (VCO) in response to the control signal.

26. The method of claim 25, wherein first and second charge pumps are used to generate the first and second charge signals, and wherein the method further comprises biasing current sources in the VCO and in the first and second charge pumps.

27. The method of claim 25 wherein a capacitor of the first loop filter suppresses high frequency noise in the first charge signal and wherein a capacitor in the second loop filter prevents the second charge signal from fluctuating too rapidly for the VCO to track.

28. The method of claim 25 wherein the capacitance value of the second loop filter is less than about 2% of the capacitance value of the first loop filter.

29. The method of claim 28 wherein the capacitance value of the second loop filter is greater than about 1% of the capacitance value of the first loop filter.

30. The method of claim 25 wherein the capacitance values of the first and second loop filters are set to optimize between reference-feed-through jitter and loop stability.

* * * * *